United States Patent [19]

Mukogawa

[11] Patent Number: 5,331,193
[45] Date of Patent: Jul. 19, 1994

[54] SEMICONDUCTOR DEVICE RESISTANT TO SLIP LINE FORMATION

[75] Inventor: Yasukazu Mukogawa, Hyogo, Japan

[73] Assignee: Mitsubishi Denki Kabushiki Kaisha, Tokyo, Japan

[21] Appl. No.: 17,164

[22] Filed: Feb. 12, 1993

[30] Foreign Application Priority Data

Feb. 14, 1992 [JP] Japan ............................ 4-028413
Jan. 20, 1993 [JP] Japan ............................ 5-007797

[51] Int. Cl.$^5$ ................ H01L 29/360; H01L 29/380; H01L 29/730
[52] U.S. Cl. ........................... 257/371; 257/350; 257/378; 257/612
[58] Field of Search ............ 257/273, 274, 378, 557, 257/67, 74, 370, 913, 617, 273, 274, 378, 557, 67, 74, 370

[56] References Cited

U.S. PATENT DOCUMENTS 3,920,484  11/1975  Ogura et al. ................. 257/378

FOREIGN PATENT DOCUMENTS 57-180148  11/1982  Japan .
63-14449   1/1988   Japan .
2-46770    2/1990   Japan .
2-183510   7/1990   Japan .

OTHER PUBLICATIONS

Sze, S. M., *Semiconductor Devices, Physics and Technology*, John Wiley and Sons, New York, 1985, pp. 301-320.

Takao Abe, "The Present Qualities and Future Issues in Silicon Bulk Crystals and Wafer Surfaces", *Advanced Silicon Technology for ULSI I*, Shin-Etsu Handotai Co., Ltd. pp. 67, 56-57.

*Primary Examiner*—Rolf Hille
*Assistant Examiner*—David B. Haroy
*Attorney, Agent, or Firm*—Lowe, Price, LeBlanc & Becker

[57] ABSTRACT

A semiconductor substrate allowing prevention of the breakdown voltage degradation of a gate oxide film and having a prescribed mechanical strength in order to cope with increase in the diameters of wafers corresponding to reduction in the dimensions of semiconductor devices and improvement in productivity, and a Bi-CMOS semiconductor device allowing electrical characteristics to be maintained in any of a bipolar transistor and a field effect transistor are provided. An epitaxial layer is formed on a silicon wafer formed by means of CZ method. A silicon wafer formed by means of FZ method is joined onto the epitaxial layer. An npn bipolar transistor is formed in the epitaxial layer. An n channel MOS transistor and a p channel MOS transistor are formed in the silicon wafer.

7 Claims, 16 Drawing Sheets (100)

(111)

SEMICONDUCTOR DEVICE RESISTANT TO SLIP LINE FORMATION

BACKGROUND OF THE INVENTION

1. Field of the Invention

The present invention relates generally to semiconductor devices using a substrate formed of two semiconductor substrates joined such as a silicon wafer and manufacturing methods thereof, and more specifically, to a so-called Bi-CMOS semiconductor device in which a bipolar transistor and a field effect transistor are formed using two kinds of semiconductor substrates of different oxygen concentrations and a manufacturing method thereof.

2. Description of the Background Art

Recently, silicon wafers are often used for semiconductor substrates in manufacturing semiconductor devices. Methods of manufacturing silicon wafers are roughly classified into CZ method (Czochralski method), FZ method (Floating Zone method), and MCZ method (Magnetic-field-applied Czochralski method). Silicon wafers manufactured according these three methods posses the following properties, respectively.

(i) CZ silicon wafer
Oxygen concentration: $1.0-1.8 \times 10^{18}$ atoms/cm$^3$
High in mechanical strength (ii) MCZ silicon wafer
Oxygen concentration: $2-8 \times 10^{17}$ atoms/cm$^3$
Medium in mechanical strength (iii) FZ silicon wafer
Oxygen concentration: $<1 \times 10^{16}$ atoms/cm$^3$
Low in mechanical strength Among the above-stated three kinds of silicon wafers, mostly used for semiconductor substrates for use in large scale integrated circuit devices (LSI) recently are silicon wafers manufactured according to the CZ method. Especially in the case of a silicon wafer having a diameter of 8 inch or larger, use of a silicon wafer manufactured by the CZ method is inevitable for its strength so that the wafer will not be damaged in a manufacturing process.

When a wafer is manufactured by the CZ method, a quartz crucible is generally used. Accordingly, oxygen is supplied from the silicon crucible to silicon monocrystal in the manufacture, and a silicon wafer having a high oxygen concentration in the range from 1.0 to $1.8 \times 10^{18}$ atoms/cm$^3$ is produced. With oxygen taken up high in concentration, the mechanical strength of the wafer itself is enhanced. Therefore, a CZ wafer can be used for a wafer with a larger diameter for the purpose of improving productivity.

As described above, a CZ silicon wafer has a high oxygen concentration in the range from 1.0 to $1.8 \times 10^{18}$ atoms/cm$^3$. Accordingly, if a silicon oxide film is formed on a CZ silicon wafer, the silicon oxide film will have many defects. Therefore, when a silicon oxide film is used for a gate oxide film for a field effect transistor, for example, the breakdown voltage of the oxide film degrades in accordance with reduction of the size of a semiconductor device to be formed in a silicon wafer.

According to the FZ method, a silicon wafer having a low oxygen concentration can be manufactured. However, the mechanical strength of an FZ silicon wafer is poor as compared to a CZ silicon wafer because of its low oxygen concentration. Therefore, subjected to a treatment with a number of heat histories, an FZ silicon wafer is prone to be damaged. On the other hand, a high quality silicon oxide film with few defects can be formed on the FZ silicon wafer because of its low oxygen concentration.

In Japanese Patent Laying-Open No. 2-46770, a semiconductor device of SOI structure is proposed which use a substrate formed of a CZ silicon wafer of high oxygen concentration and an FZ silicon wafer of low concentration thereon joined with each other. According to the semiconductor device, the property of a gate oxide film can be improved by forming a silicon oxide film on the FZ silicon wafer of low oxygen concentration even if size reduction further precedes. Furthermore, the CZ silicon wafer provides a high mechanical strength, and increase in the diameters of wafers can be achieved in order to further improve productivity.

A method of manufacturing a substrate for a semiconductor device having two silicon wafers directly joined with each other is, for example, disclosed in Japanese Patent Laying-Open No. 2-183510.

Formation of an MOS semiconductor device including a field effect transistor having a substrate of a CZ silicon wafer and an FZ silicon wafer joined thereon provides a semiconductor device free from degradation in electrical characteristics by improvement of the breakdown voltage of a gate oxide film, etc., even if size reduction further proceeds. However, when a so-called Bi-CMOS semiconductor device in which a bipolar transistor and a field effect transistor are formed within a single substrate is formed on the above-stated joined FZ silicon wafer, the following problem is encountered. The problem will be further described while sequentially describing steps in a manufacturing method of a Bi-CMOS semiconductor device.

FIGS. 22-33 are partial cross sectional views sequentially showing manufacturing steps for forming a Bi-CMOS semiconductor device in an FZ silicon wafer joined on a CZ silicon wafer.

A silicon wafer is manufactured according to the CZ method. Another silicon wafer is manufactured according to the FZ method. The surface of each of the silicon wafers is washed, highly cleaned, and made hydrophilic. Thus treated CZ silicon wafer and FZ silicon wafer have their surfaces mechanically joined with each other. Thereafter, the joined wafers are subjected to heat treatment at a temperature in the range from 500° to 1000° C. and a dehydration condensation reaction takes place between the joined surfaces of CZ silicon wafer and FZ silicon wafer. Control of the heat treatment permits the joining of the CZ silicon wafer and the FZ silicon wafer to be enhanced. Thus, as shown in FIG. 22, a silicon substrate formed of a p type CZ silicon wafer 100 and a p type FZ silicon wafer 300a thereon joined with each other is manufactured.

Referring to FIG. 23, p type and n type impurity ions each in a dose about in the range from $10^{15}-10^{16}$/cm$^2$ are introduced into prescribed regions of the FZ silicon wafer 300a. Thereafter, heat treatment at a temperature from 700° to 1100° C. is conducted, whereby n+ buried diffusion layers 371, 374 and p+ buried diffusion layers 372, 373 are formed.

Referring to FIG. 24, an n− epitaxial layer 400 having a thickness in the range from 2 to 10 μm is formed at a temperature in the range from 650° to 1100° C. on a surface of the FZ silicon wafer 300a.

As shown in FIG. 25, n type and p type impurity ions each in a dose of about in the range from $10^{12}$ to $10^{13}$/cm$^2$ are implanted into prescribed regions of the n⁻ epitaxial layer 400. Thereafter, lamp annealing treatment is conducted at a temperature in the range from 600° to 1000° C. and n type well regions 401, 403, 405, and p type well regions 402, 404 are formed as a result. Thus, the well regions are formed as CMOS transistor formation regions.

As shown in FIG. 26, p type impurity ions in a dose of about in the range from $10^{12}$ to $10^{14}$/cm² are implanted in to the p type well region 402. Thereafter, lamp annealing treatment is conducted at a temperature in the range from 600° to 1000° C., and a p type isolation region formed of a p+ region 402, a p⁻ region 406, and a p+ buried diffusion layer 372 is formed as a result.

Referring to FIG. 27, isolation oxide films 407, 408, 409 are formed so as to isolate a prescribed element formation region in the n⁻ epitaxial layer 400. At that time, n regions 410, 411, 413, and a p region 412 are formed.

Referring to FIG. 28, n type impurity ions in a dose of about in the range from $10^{14}$ to $10^{17}$/cm² are implanted into a region of the n region 410. Thereafter, lamp annealing treatment is conducted at a temperature in the range from 600° to 1000° C., and an n+ collector wall 414 is formed as a result.

As shown in FIG. 29, gate oxide films 415 and 416 are formed in the p region 412 and the n region 413, respectively. Gate electrodes 417 and 418 having a polycide structure are formed on the gate oxide films 415 and 416, respectively. Using the gate electrode 417 or 418 as mask, n type and p type impurity ions each in a dose about in the range from $10^{15}$ to $10^{16}$/cm² are implanted. Thereafter, lamp annealing treatment is conducted at a temperature in the range from 600° to 1000° C., and n type source/drain regions 419 and p type source/drain regions 420 are formed as a result. Thus, an n channel MOS transistor 450 and a p channel MOS 460 are formed.

As shown in FIG. 30, p type impurity ions in a dose about in the range from $10^{13}$ to $10^{15}$/cm² are implanted into the n region 410. Thereafter, lamp annealing treatment is conducted at a temperature in the range from 600° to 1000° C. thereby forming a p+ base region 421.

As shown in FIG. 31, n type impurity ions in a dose about in the range from $10^{15}$ to $10^{16}$/cm² are implanted into a region of the p+ base region 421. Thereafter, lamp annealing treatment is conducted at a temperature in the range from 600° to 1000° C., thereby forming an n+ emitter region 422.

An npn bipolar transistor 470 is thus formed.

As shown in FIG. 32, an interlayer insulating film 423 formed of an oxide film is formed on the entire surface of the FZ silicon wafer 300a, covering the bipolar transistor 470, the n channel MOS transistor 450, and the p channel MOS transistor 460.

Finally, as shown in FIG. 33, contact holes are made in the interlayer insulating film 423. Through the contact holes, aluminum interconnection layers 424, 425, 426, 427, 428, 429, and 430 are formed in contact with the surfaces of the collector region, the emitter region, the base region, the source region, and the drain region, respectively. As described above, a Bi-CMOS semiconductor device is formed in a substrate formed of the CZ silicon wafer 100 and the FZ silicon wafer 300a thereon joined with each other.

In the above-stated manufacturing steps, the epitaxial layer 400 is formed on the FZ silicon wafer 300a in order to form a bipolar transistor. At that time, a slip line is produced in the silicon wafer. FIG. 34 is a plan view showing slip lines produced in forming the epitaxial layer on the FZ silicon wafer 300a. FIG. 34 shows at (A) slip lines produced in a silicon wafer surface orientation (100). FIG. 34 shows at (B) slip line produced in a silicon wafer surface orientation (111). 380 represents an orientation flat. As can be seen from (A), slip lines 501 are produced in the peripheral portion of the FZ silicon wafer 300a. Referring to (B), it is observed that slip lines 502 formed in the peripheral part of the FZ silicon wafer 300a form a prescribed angle. Such a slip line is considered to be a gathering of dislocations each as a lattice defect of crystal.

FIG. 35 is an enlarged cross sectional view showing a bipolar transistor formed in an epitaxial layer including a slip line as described above. Referring to FIG. 33, a p+ base region 421 is formed in an n+ epitaxial layer 400. An n+ emitter region 422 is formed in the p+ base region 421. A depletion layer 431 is formed between the p+ base region 421 and the n+ emitter region 422. In this case, a slip line 500 extends from the p+ base region 421 to n+ emitter region 422. With the slip line 500 existing in a pn junction in this manner, current leakage is likely to take place. As a result, the electrical characteristic of the bipolar transistor deteriorates, resulting in an erroneous operation of the transistor. Accordingly, faulty Bi-CMOS semiconductor devices are produced. Faulty Bi-CMOS semiconductor devices are produced in the periphery of the FZ silicon wafer 300a with a slip line 501 or 502. Therefore, the peripheral portion of the silicon wafer with the faulty devices is cut away. This results in degradation in manufacturing yield for the Bi-CMOS semiconductor devices.

SUMMARY OF THE INVENTION

It is one object of the present invention to provide a high electrical characteristic both in field effect transistor and a bipolar transistor, in a semiconductor device using a semiconductor substrate having a high mechanical strength.

Another object of the present invention is to provide an arrangement of a semiconductor device which can cope with increase in the diameter of a silicon wafer.

A still another object of the present invention is to prevent a slip line from being produced in a semiconductor layer in which a bipolar transistor is to be formed.

A further object of the present invention is to prevent the breakdown voltage of a gate oxide film in a field effect transistor from degrading in accordance with reduction in the dimension of elements.

A semiconductor device in accordance with one aspect of the present invention includes a first semiconductor substrate, a semiconductor layer, a second semiconductor substrate, a bipolar transistor, and a field effect transistor. The first semiconductor substrate has a main surface and contains oxygen in a first concentration. The semiconductor layer is formed by epitaxial growth on the main surface of the first semiconductor substrate. The second semiconductor substrate is joined onto the semiconductor layer, and contains oxygen in a second concentration lower than the first concentration. The bipolar transistor is formed in the semiconductor layer. The field effect transistor is formed in the second semiconductor substrate.

In a method of manufacturing a semiconductor device in accordance with another aspect of the present invention, the semiconductor layer is formed by epitaxial growth on the main surface of the first semiconductor substrate containing oxygen in the first concentration. The bipolar transistor is formed in the semiconductor layer. The second semiconductor substrate containing oxygen in the second concentration lower than the first concentration is joined onto the semiconductor layer. The field effect transistor is formed in the second semiconductor substrate.

In the semiconductor device of the present invention, the first semiconductor substrate containing oxygen in a relatively high concentration is used for one substrate. The semiconductor layer is formed on the first semiconductor substrate by means of epitaxial growth. Accordingly, the semiconductor layer is free from any slip lines. Containing oxygen in the relatively high concentration, the first semiconductor substrate has a high mechanical strength. Thus, increase in the diameters of silicon wafers in accordance with improvements in productivity can be addressed.

The field effect transistor is formed in the second semiconductor substrate whose oxygen concentration is relatively low. Thus, the breakdown voltage of an oxide film formed on the surface of the second semiconductor substrate will not degrade with reduction in the dimensions of devices. Accordingly, if further reduction in the dimensions of devices is achieved, the electrical characteristics of field effect transistors can be maintained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
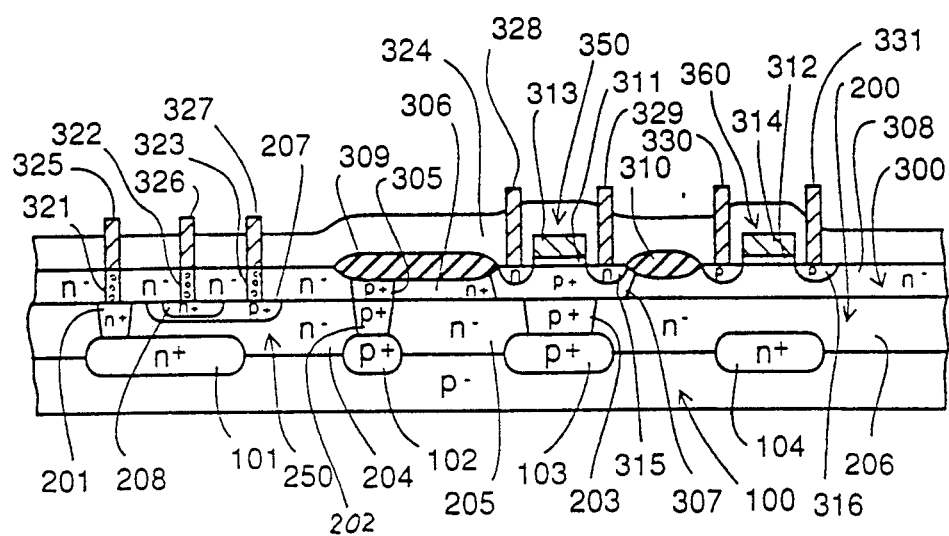
FIG. 1 is a partial cross sectional view showing a Bi-CMOS semiconductor device in accordance with one embodiment of the present invention.

Referring to FIG. 1, n+ buried diffusion layers 101, 104 and p+ buried diffusion layers 102, 103 are formed on a surface of a p type CZ silicon wafer 100. An n− epitaxial layer 200 is formed on the CZ silicon wafer 100. An n+ collector wall layer 201 and an n− region 204 are formed in the n− epitaxial layer 200. A p+ base region 207 is formed in the n− region 204. An n+ emitter region 208 is formed in the p+ base region 207. Thus, an npn bipolar transistor 250 is formed in the n− epitaxial layer 200. p+ isolation regions 202, 203 are formed in the n− epitaxial layer 200. In this manner, the n− regions 204, 205, and 206 are electrically isolated from each other. An n type FZ silicon wafer 300 is joined onto the n− epitaxial layer 200.

A p+ isolation region 305, an n+ region 306, a p+ region 307, and an n− region 308 are formed in the FZ silicon wafer 300. An n channel MOS transistor 350 is formed in the p+ region 307. A p channel MOS transistor 360 is formed in the n− region 308. The n channel MOS transistor 350 includes a pair of n type source/drain regions 315, and a gate oxide film 311 and a gate electrode 313 formed therebetween. The p channel MOS transistor 360 includes a pair of p type source/drain regions 316, and a gate oxide film 312 and a gate electrode 314 formed therebetween.

In order to isolate the bipolar transistor 250, the n channel MOS transistor 350, and the p channel MOS transistor 360 from each other, isolation oxide films 309, 310 are formed on a surface of the FZ silicon wafer 300. An interlayer insulating film 324 is formed on the FZ silicon wafer 300 so as to cover the bipolar transistor 250 and the MOS transistors 350 and 360. Contact holes are formed in this interlayer insulating film 324 so as to expose surfaces of a collector region, an emitter region, a base region and source/drain regions. Aluminum interconnection layers 325, 326, 327, 328, 329, 330, and 331 are formed to establish contact to the respective regions through the contact holes. The n+ collector wall layer 201, p+ base region 207, and n+ emitter region 208 of the npn bipolar transistor 250 are connected to the aluminum interconnection layers 325, 327, and 326, respectively through plug electrodes 321, 323, and 322 formed in the FZ silicon wafer 300.

Now, a manufacturing method of thus constructed Bi-CMOS semiconductor device will be described.

Figure 2:
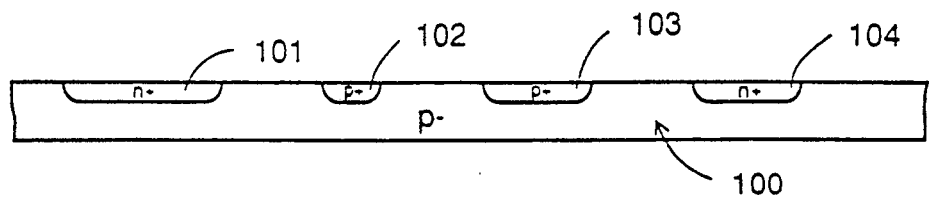
FIGS. 2–18 are partial cross sectional views sequentially showing steps in a manufacturing method of the Bi-CMOS semiconductor device shown in FIG. 1.

Referring to FIG. 2, p type and n type impurity ions are implanted each in a dose in the range from $10^{15}$ to $10^{16}/cm^2$ into prescribed regions of the p type CZ silicon wafer 100. Then, a heat treatment is conducted at a temperature in the range from 700° to 1100° C., thus forming the n+ buried diffusion layers 101, 104, and the p+ buried diffusion layers 102, 103.

Figure 3:
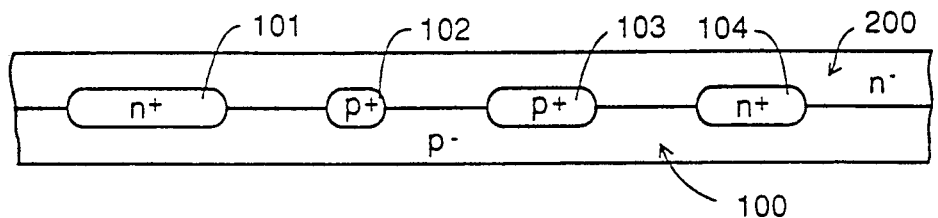

As shown in FIG. 3, the n− epitaxial layer 200 as thick as 2–10 μm is formed at a temperature from 650° to 1100° C. on the CZ silicon wafer 100. At that time, the oxygen concentration of the CZ silicon wafer 100 is a relatively high value about in the range from 1.0 to $1.8 \times 10^{18}/cm^3$, and epitaxial growth of silicon on the CZ silicon wafer 100 therefore does not result in slip lines in the epitaxial layer 200.

Figure 4:
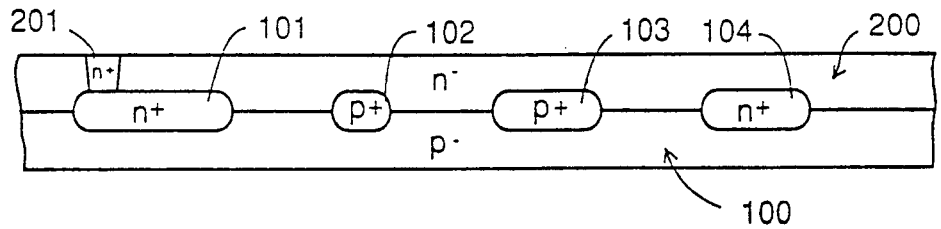

Referring to FIG. 4, n type impurity ions in a dose about in the range from $10^{14}$ to $10^{17}/cm^2$ are implanted into prescribed region of the n− epitaxial layer 200. Thereafter, lamp annealing treatment is conducted at a temperature from 600° to 1000° C., thereby forming the n− collector wall layer 201.

Figure 5:
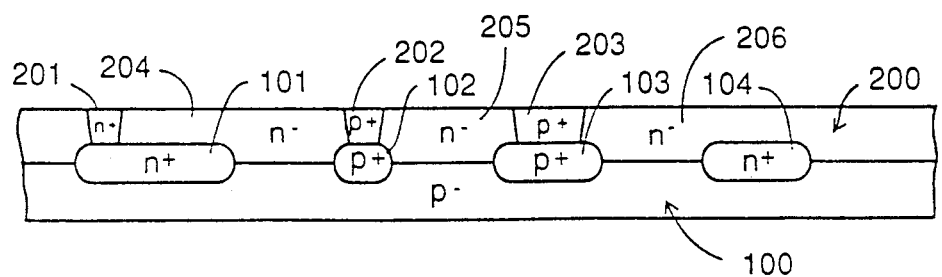

As shown in FIG. 5, p type impurity ions in a dose about in the range from $10^{12}$ to $10^{14}/cm^2$ are implanted into the regions of the n− epitaxial layer 200 respectively above the p+ buried diffusion layers 102 and 103. Thereafter, lamp annealing treatment is conducted at a temperature in the range from 600° to 1000° C., thus forming the p+ isolation regions 202 and 203. Thus, the n− regions 204, 205, and 206 are formed to be electrically isolated from each other.

Figure 6:
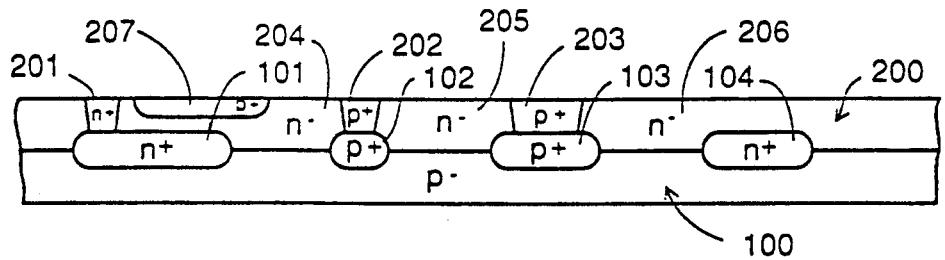

As shown in FIG. 6, p type impurity ions in a dose about in the range from $10^{13}$ to $10^{15}/cm^2$ are implanted into a region of the n⁻ region 204. Thereafter, lamp annealing treatment is conducted at a temperature in the range from 600° to 1000° C., thus forming the p+ base region 207.

Figure 7:
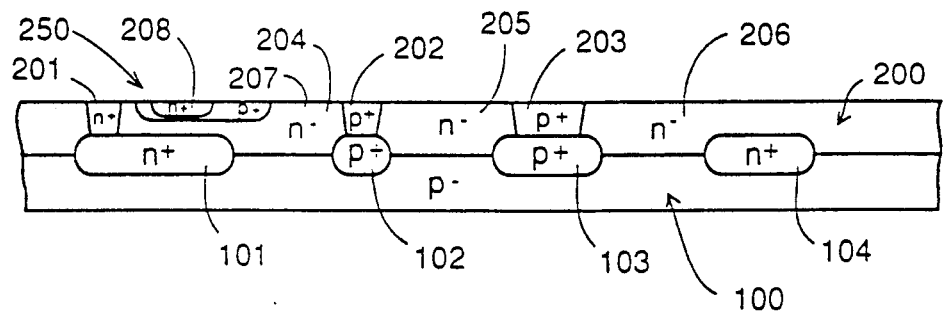

As shown in FIG. 7, n type impurity ions in a dose about in the range from $10^{15}$ to $10^{16}/cm^2$ are implanted into a region of the p+ base region 207. Thereafter, lamp annealing treatment is conducted at a temperature in the range from 600° to 1000° C., thus forming the n+ emitter region 208. Thus, the npn bipolar transistor 250 is completed.

Now, by means of the FZ method, a silicon wafer having a relative low oxygen concentration, e.g. $1 \times 10^{16}/cm^3$ is manufactured. The surface of the CZ silicon wafer 100 on which the bipolar transistor 250 is formed, the surface of the epitaxial layer 200 and the surface of the FZ silicon wafer to be exist, are washed and cleaned, and made hydrophilic. Thus treated CZ silicon wafer 100 and FZ silicon wafer are mechanically joined with each other. Thereafter, heat treatment at a temperature in the range from 500° to 1000° C. is conducted, causing a dehydration condensation reaction on the joined surfaces of the CZ silicon wafer 100 and the FZ silicon wafer.

Figure 21A:
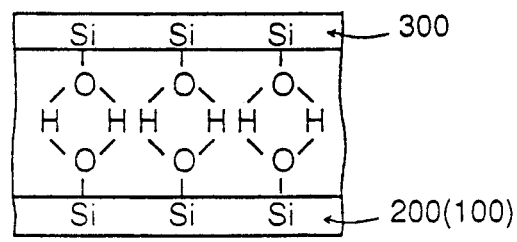
FIG. 21 includes schematic representations (a) and (b) showing dehydration condensation reactions associated with a step of joining a CZ silicon wafer and an FZ silicon wafer.
Figure 21B:
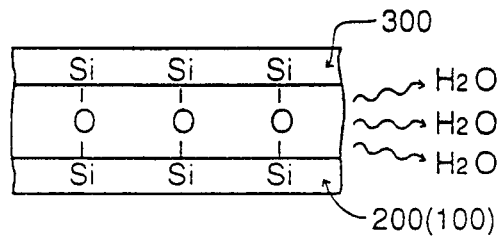
Figure 22:
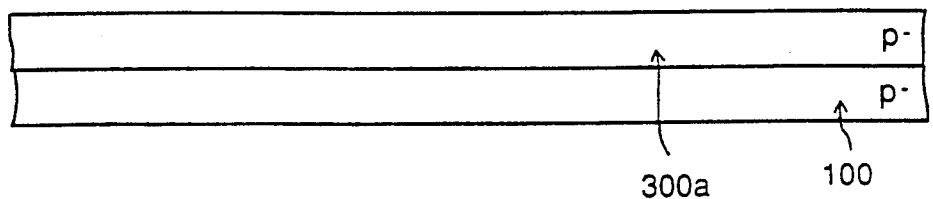
FIGS. 22–33 are partial cross sectional views sequentially showing steps in a manufacturing method of a conventional Bi-CMOS semiconductor device.
Figure 23:
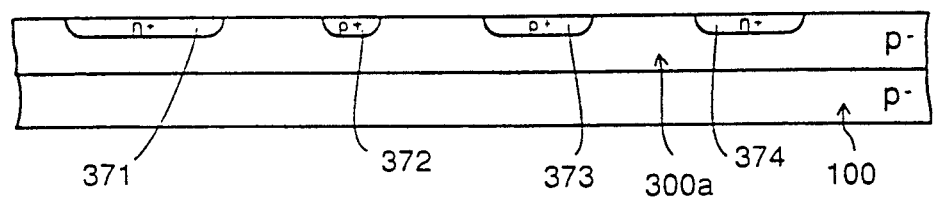
Figure 24:
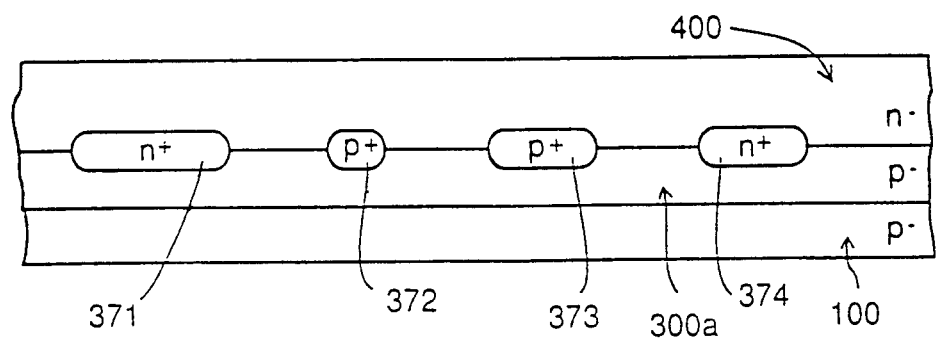
Figure 25:
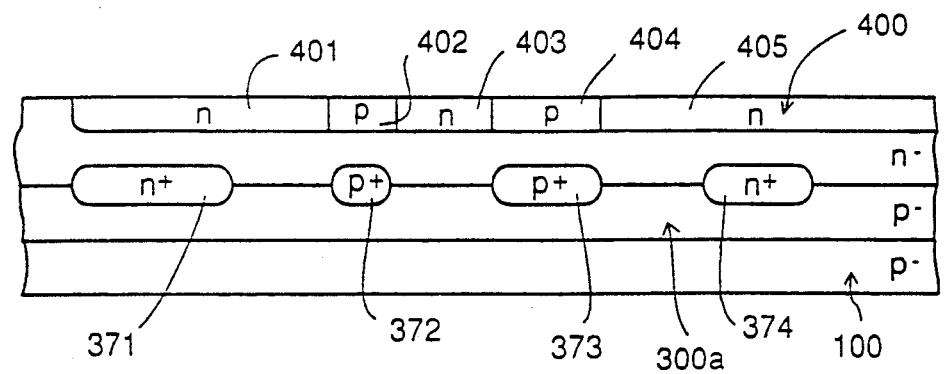
Figure 26:
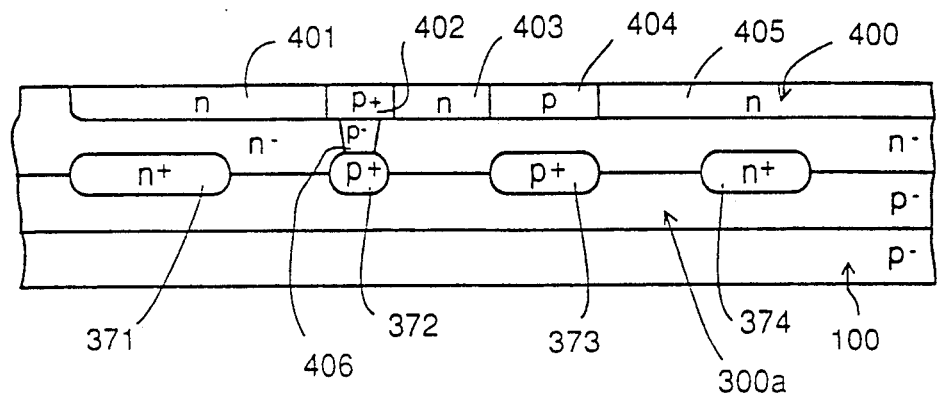
Figure 27:
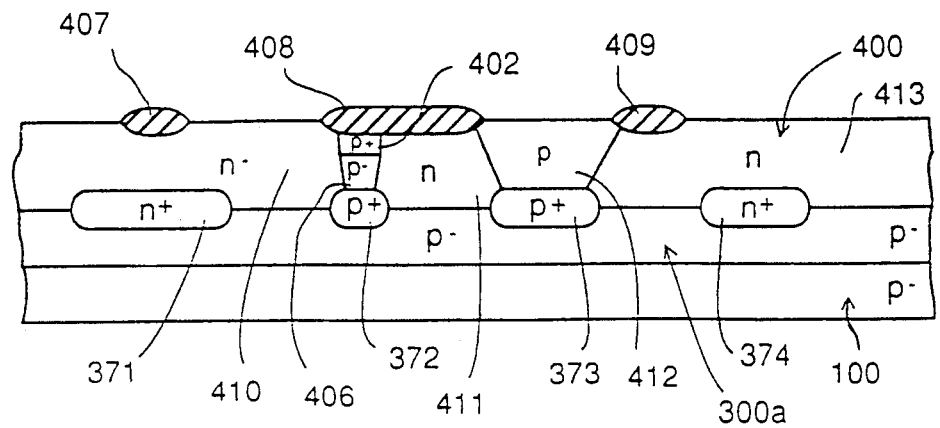
Figure 28:
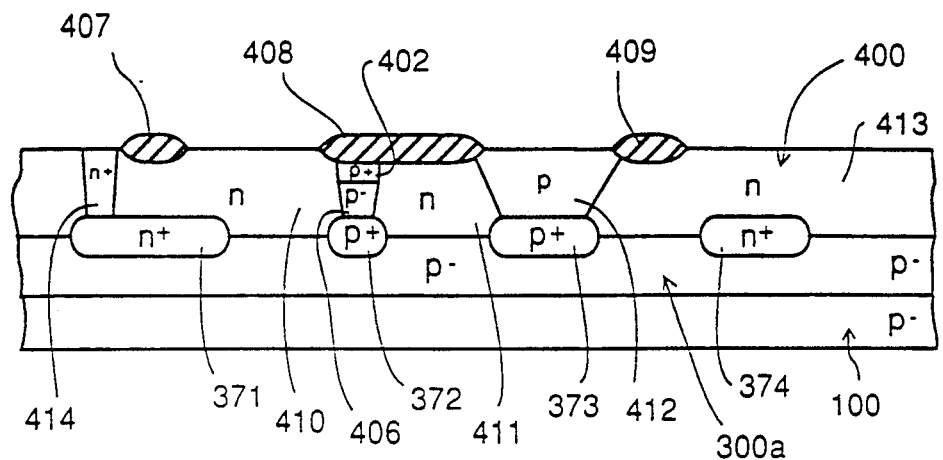
Figure 29:
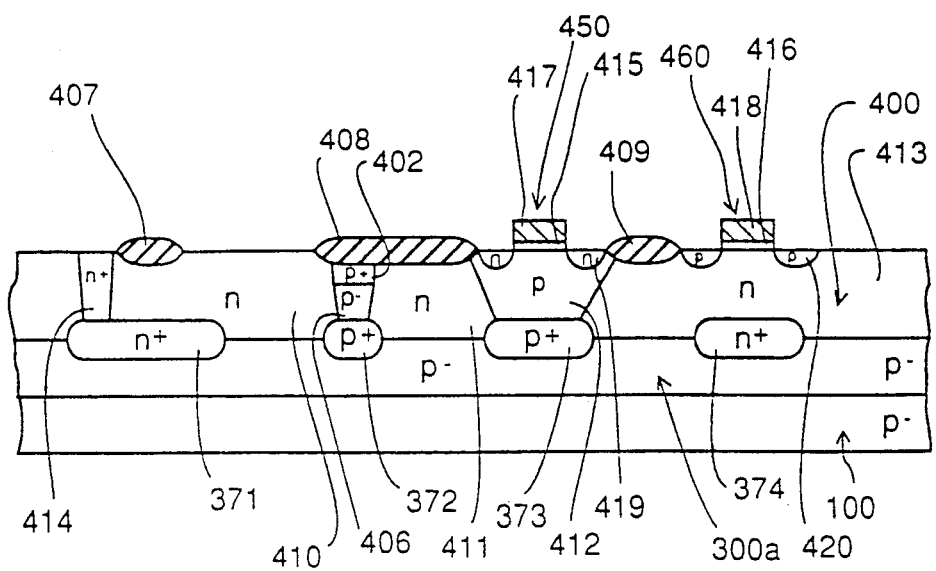
Figure 30:
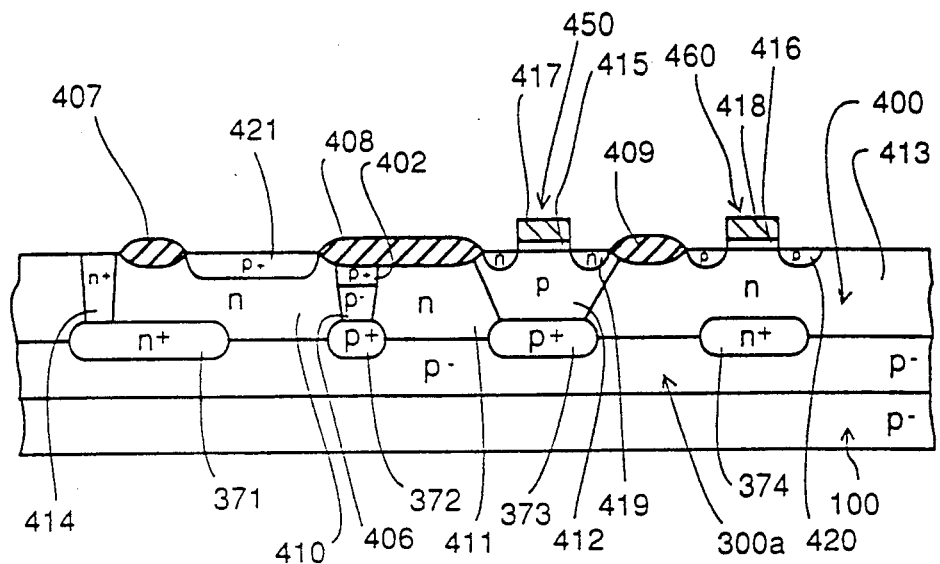
Figure 31:
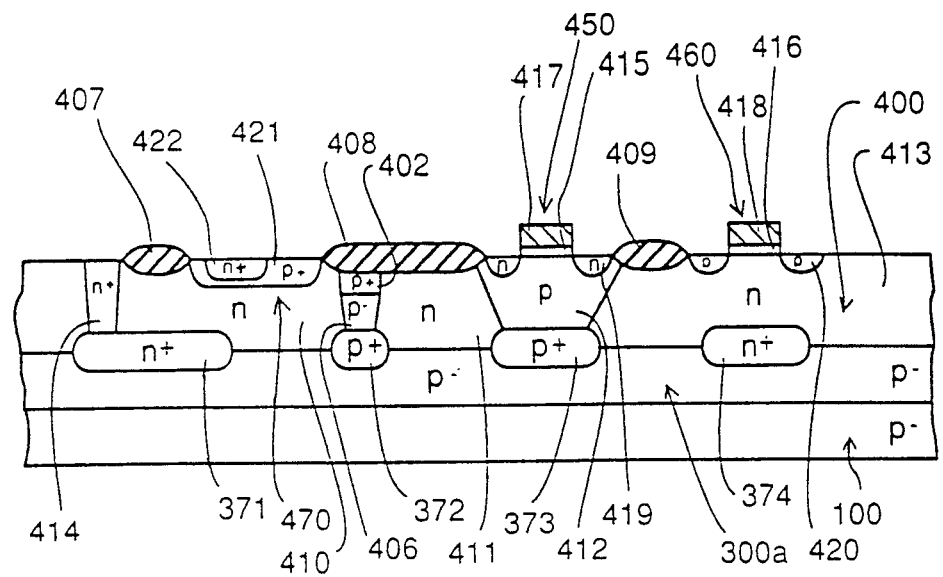
Figures 32, 33:
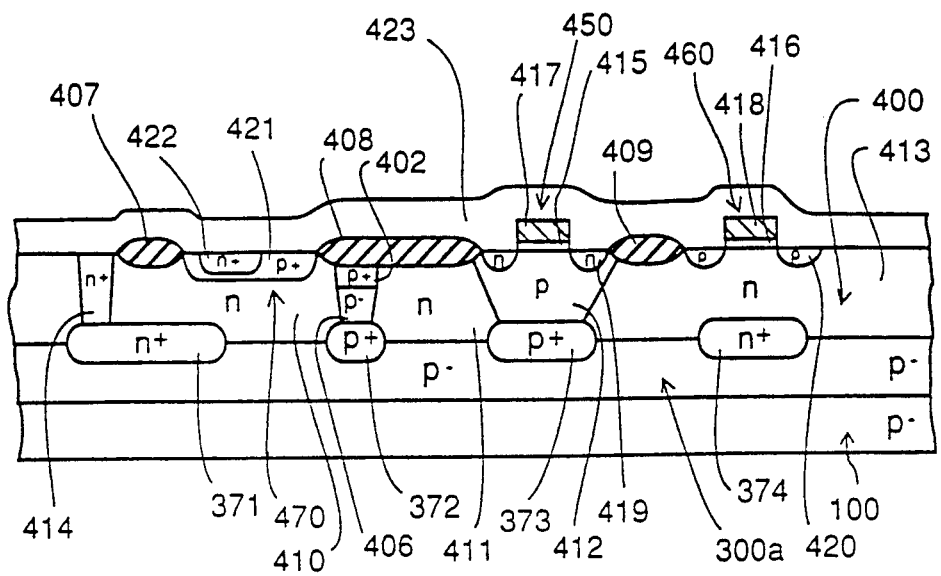
Figure 34A:
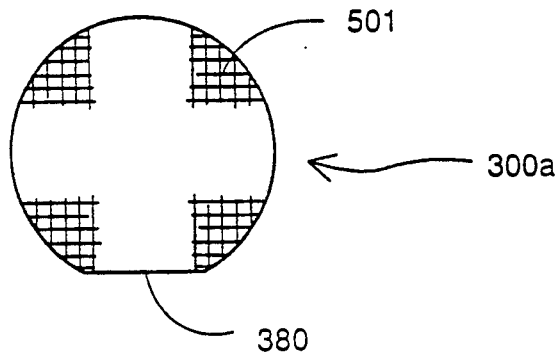
FIG. 34 includes schematic views (A) and (B) showing slip lines produced when epitaxial growth of silicon is conducted on an FZ silicon wafer.
Figure 34B:
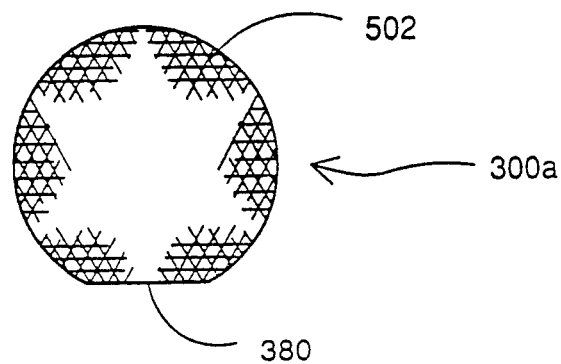
Figure 35:
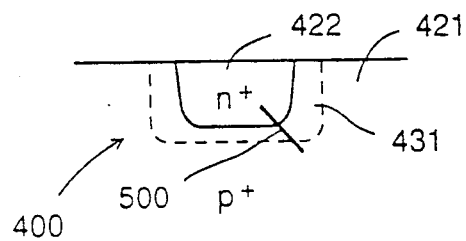
FIG. 35 is an enlarged partial cross sectional view showing a bipolar transistor formed in an epitaxial layer with a slip line.

The dehydration condensation reaction is illustrated in a schematic representation in FIG. 21. Referring to FIG. 21 at (a), the surface of the epitaxial layer 200 and the surface of the FZ silicon wafer 300 formed on the CZ silicon wafer 100 are joined with each other by hydrogen bonding. A dehydration condensation reaction takes place in the interface between thus joined epitaxially layer 200 and FZ silicon wafer 300. Consequently, water is dissipated as shown in FIG. 21 at (b), and the epitaxial layer 200 and the FZ silicon wafer 300 are joined with each other with the presence of oxygen therebetween.

Figure 8:
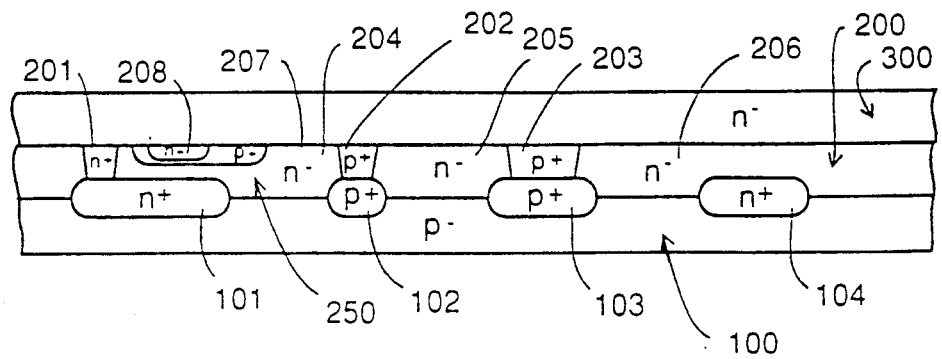

Thereafter the joining of the surfaces of these two silicon wafers is enhanced by controlling heat treatment process. A cross section of the semiconductor substrate produced in this manner is shown in FIG. 8. The n type FZ silicon wafer 300 is joined onto the n⁻ epitaxial layer 200.

Figure 9:
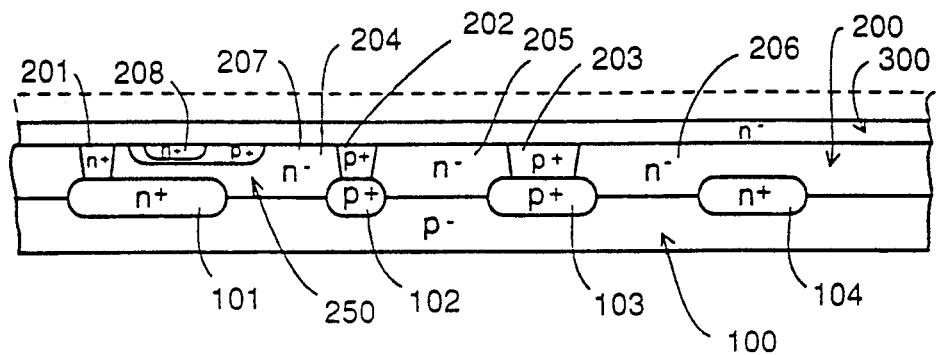

As shown in FIG. 9, the FZ silicon wafer 300 is mechanically ground to be about as thick as 10 μm. Subsequently, the surface of the FZ silicon wafer is subjected to a mirror surface polishing treatment.

Figure 10:
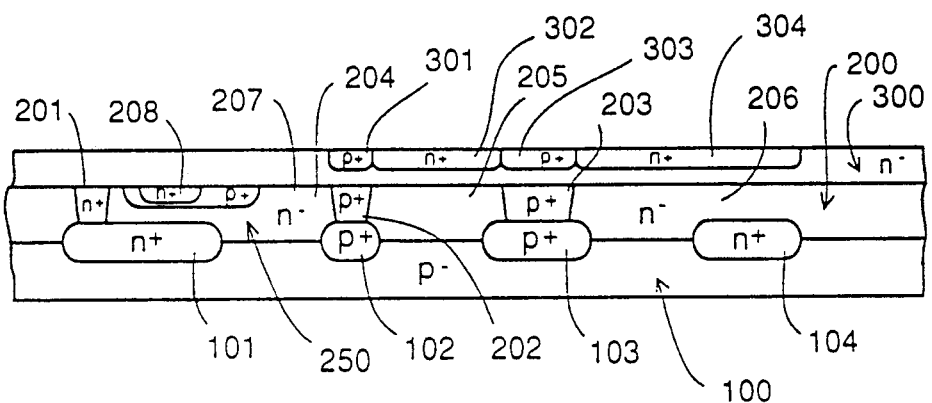

As shown in FIG. 10, p type and n type impurity ions each in a dose of about in the range from $10^{12}$ to $10^{13}/cm^2$ are implanted into prescribed regions of the FZ silicon wafer 300. Thereafter, lamp annealing treatment is conducted at a temperature from 600° to 1000° C., thus forming the p+ well regions 301, 303, and the n+ well regions 302, 304.

Figure 11:
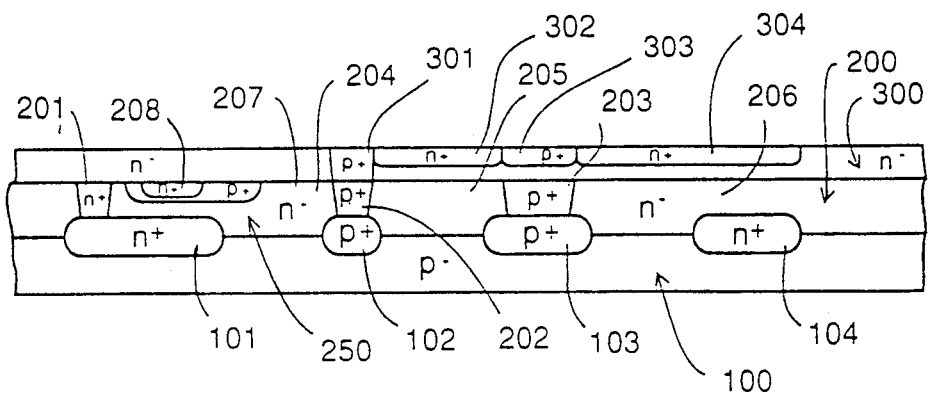

As shown in FIG. 11, p type impurity ions in a dose about in the range from $10^{12}$ to $10^{14}/cm^2$ are implanted into the p+ well regions 301, 303. Subsequently, a lamp annealing treatment is conducted at a temperature in the range from 600° to 1000° C., thus forming the p+ isolation region on the FZ silicon wafer 300.

Figure 12:
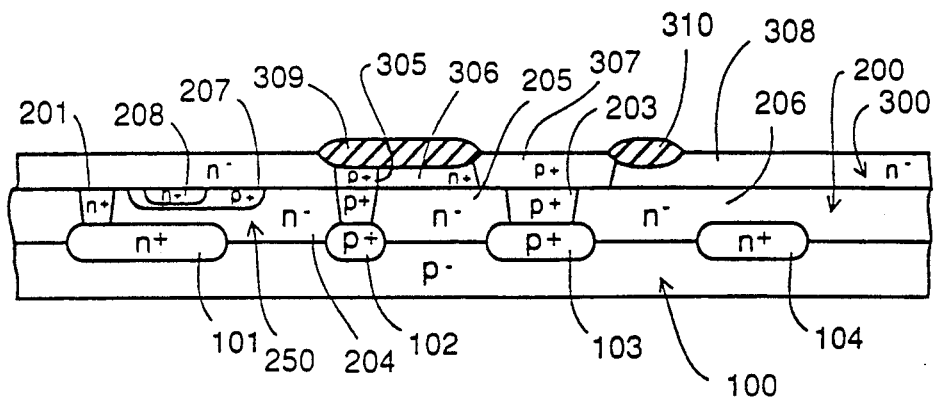

As shown in FIG. 12, isolation oxygen films 309, 310 are formed in prescribed regions of the FZ silicon wafer 300. Thus, the p+ isolation region 305, the n+ region 306, the p+ region 307, and the n⁻ region 308 are formed.

Figure 13:
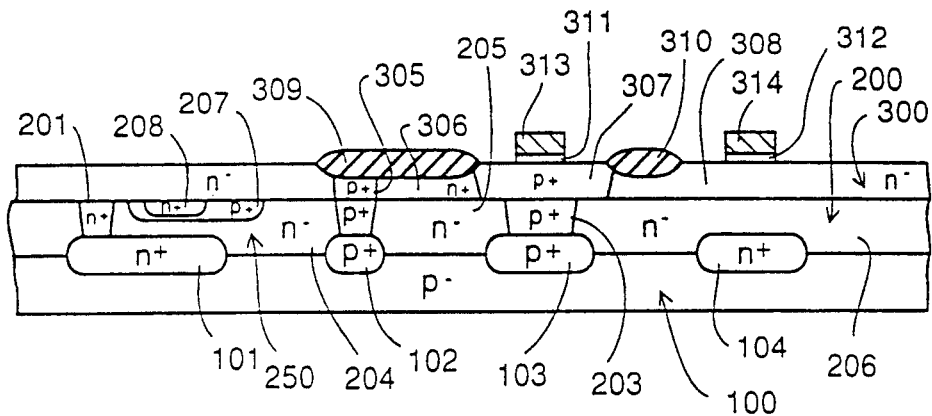

Referring to FIG. 13, the p+ region 307 and the n⁻ region 308 are both subjected to a heat treatment at a temperature in the range from 900° to 1150° C. to form oxide films, and the oxide films are patterned into the gate oxide films 311 312 as thick as 50–300 Å. The gate electrodes 313, 314 having a polycide structure are formed on the gate oxide film 311 and 312, respectively. The gate electrodes 313, 314 may be formed of the other material such as polycrystalline silicon.

Figure 14:
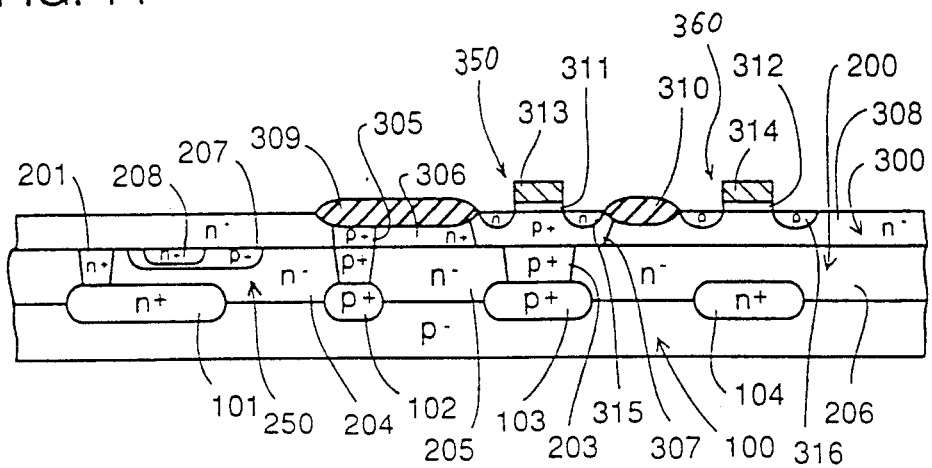

As shown in FIG. 14, using the gate electrodes 313 and 314 as mask n type and p type impurity ions each in a dose about in the range from $10^{15}$ to $10^{16}/cm^2$ are implanted. Thereafter, lamp annealing treatment is conducted at a temperature in the range from 600° to 1000° C., thus forming the n type source/drain regions 315 and the p type source/drain regions 316. In this way, the n channel MOS transistor 350 and the p channel MOS transistor 360 are formed.

Figure 15:
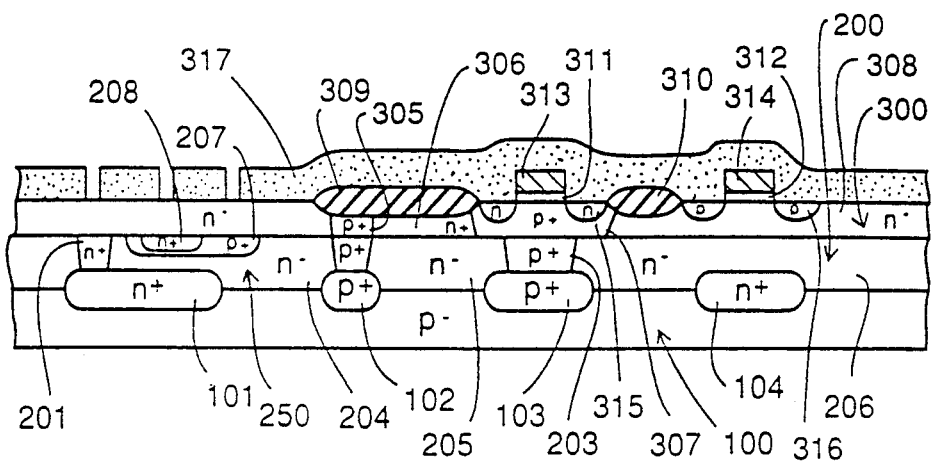

As shown in FIG. 15, a photoresist film 317 is formed on the entire surface of the FZ silicon wafer 300. The photoresist film 317 is selectively removed away by means of a photolithography technique. Thus, patterning is conducted to expose the surface of the respective regions in the bipolar transistor 250 formed in the epitaxial layer 200 on the CZ silicon wafer 100.

Figure 16:
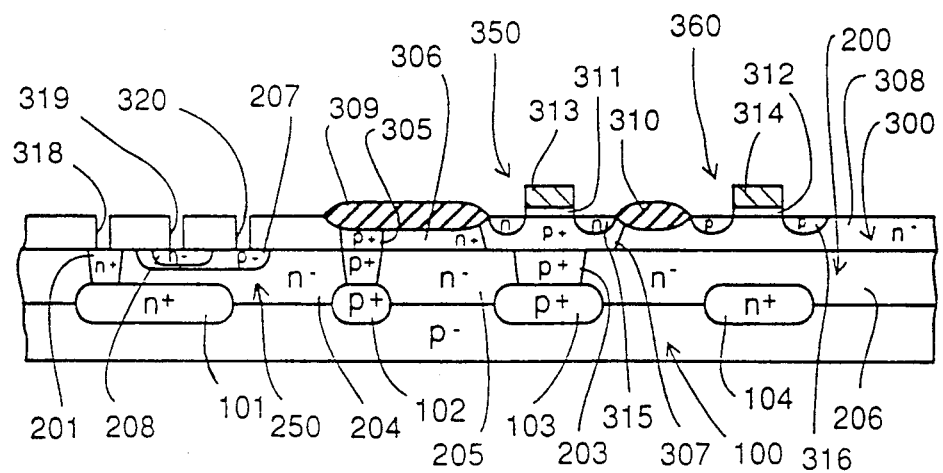

As shown in FIG. 16, using the photoresist film 317 patterned in the above-stated manner as mask, the FZ silicon wafer 300 is etched. In the case wet etching an alkaline solution such as of KOH, while in the case of dry etching, NF₃ gas or the like is used. In wet etching by KOH solution, an etching speed is about 0.2–3 μm/min. This process permits contact holes 318, 319, and 320 to be formed in the FZ silicon wafer 300 to expose the respective surfaces of the n+ collector wall layer 201, the n+ emitter region 208, and the p+ base region 207. Though not shown, insulating films are formed on the sidewalls of contact holes 318, 318 and 320.

Figure 17:
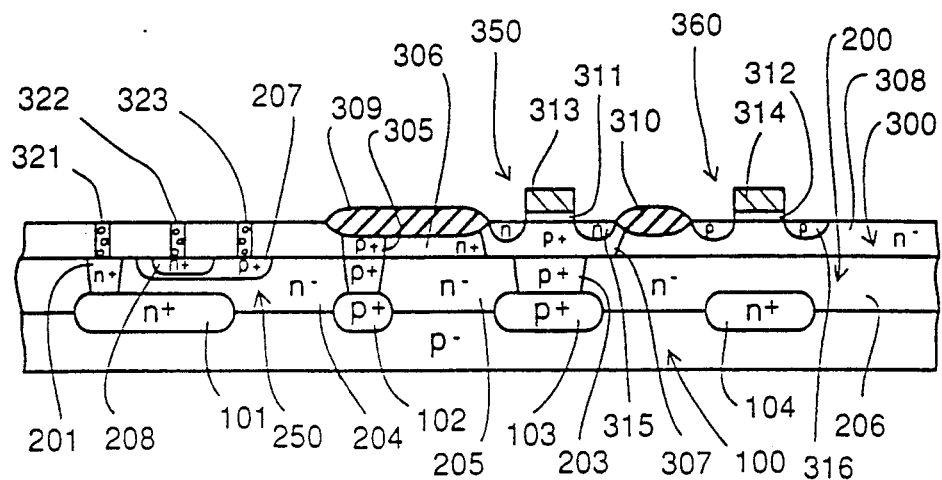

As shown in FIG. 17, a conductive layer of, for example, tungsten is formed on the entire surface by means of chemical vapor deposition (CVD). Thereafter, the conductive layer is etched back to remain only in the regions of the contact holes 318, 319, and 320. Thus, the plug electrodes 321, 322, and 323 are formed.

Figure 18:
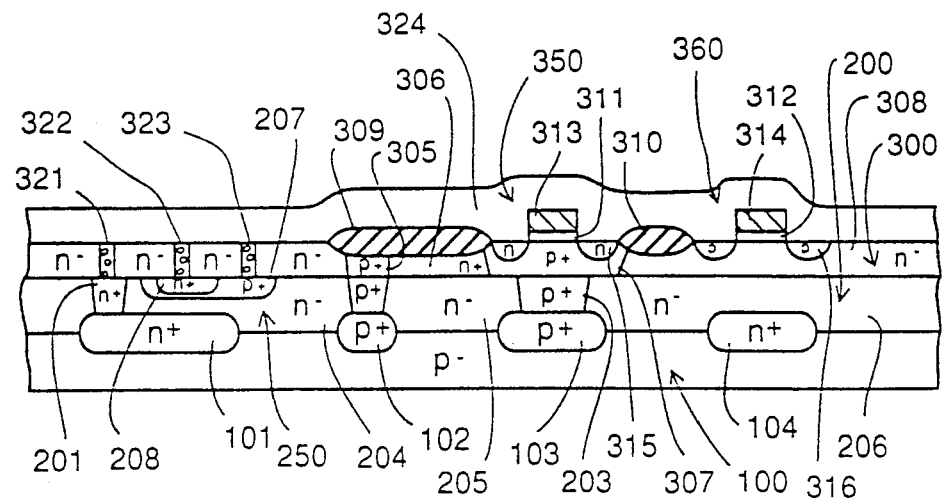

As shown in FIG. 18, the interlayer insulating film 324 is formed on the entire surface of the FZ silicon wafer 300.

Finally as shown in FIG. 1, contact holes to expose the respective surfaces of the plug electrodes 321, 322, and 323 are formed in the interlayer insulating film 324. Contact holes to expose the respective surfaces of the n type source/drain region 315 and the p type source/drain region 316 are formed in the interlayer insulating film 324. The aluminum or tungsten interconnection layers 325, 326, 327, 328, 329, 330, and 331 are formed to be in contact with the respective regions through these contact holes. The Bi-CMOS semiconductor device of the invention is thus completed.

In the above-stated embodiment, the thickness of FZ silicon wafer 300 is reduced up to about 300 μm by mechanically polishing the FZ silicon wafer 300. Thus, in the step shown in FIG. 16, time required for etching the FZ silicon wafer 300 to form contact holes can be reduced. However, in order to reduce the thickness of FZ silicon wafer 300 after the FZ silicon wafer 300 is joined to the CZ silicon wafer 100, two steps, grinder (reduces the thickness by about 200 μm) and polishing (reduces the thickness by about 30 μm) are necessary, At present, the thickness of a standard wafer is 625±15 μm for the one with a diameter of 5 inches or 6 inches and 725±15 m for the one with a diameter of 8 inches. The FZ silicon wafer 300 may be utilized in such a thickness. In a case, the step of mechanical polishing is not necessary. However, in the step shown in FIG. 16, time required for etching the FZ silicon wafer 300 to form contact holes will be increased. For example, in the case of chemical etching utilizing $HF/HNO_3/CH_3COOH$ or KOH as an etching solution, the speed of etching is in the range from 20 to 30 $\mu m/min$ ($HF/HNO_3/CH_3COOH$), or in the range from 0.2 to 3 $\mu m/min$. (KOH). Now, if the thickness FZ silicon wafer 300 is 625 $\mu m$, time for etching will be more than about 30 min. in view of the foregoing, the thickness of the FZ silicon wafer 300 is selected in the range from 10 to 75 $\mu m$. It is noted that the minimum thickness of the FZ silicon wafer is set to be 10 $\mu m$ taken into consideration the active region and separation region of MOS transistors.

Figure 19:
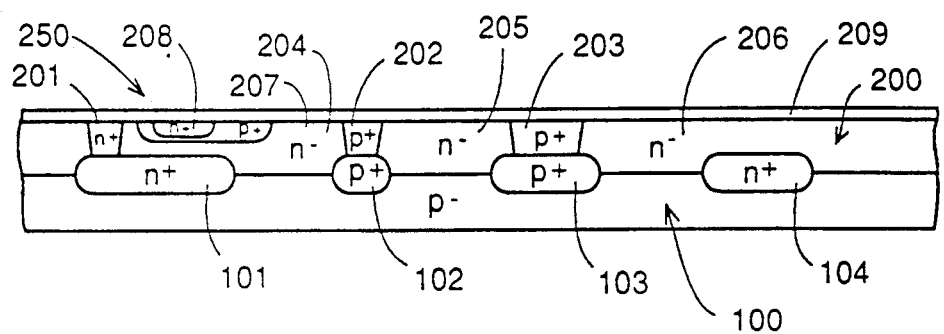
FIG. 19 is a partial cross sectional view showing a step in another manufacturing method fo a Bi-CMOS semiconductor device.

Furthermore, in the above described embodiment, as illustrated in FIG. 8, although the FZ silicon wafer 300 is formed immediately on the n⁻ epitaxial layer 200, an oxide film 209 of a thickness around in the range from 1000 to 2000 Å may be formed on the n⁻ epitaxial layer 200 and then the FZ silicon wafer 300 may be joined thereon as illustrated in FIG. 19.

Figure 20:
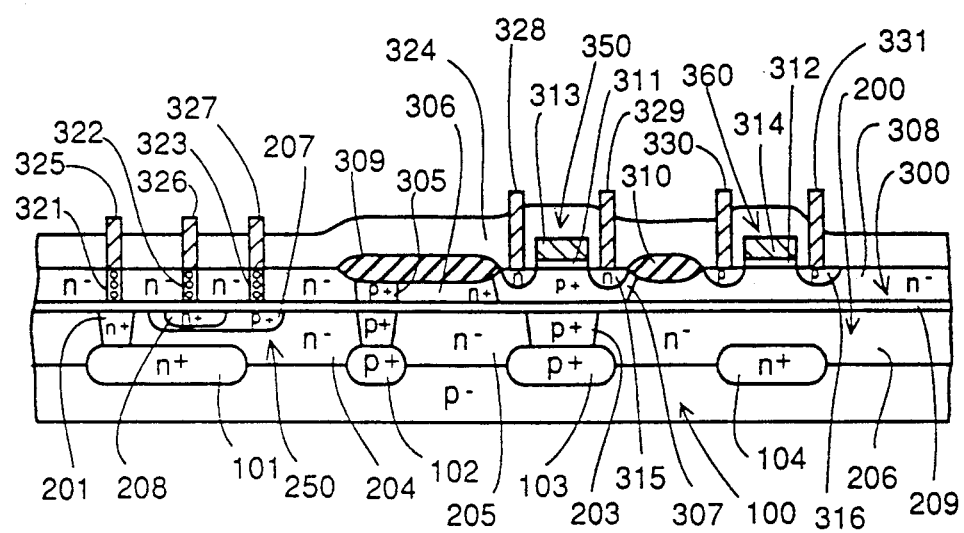
FIG. 20 is a partial cross sectional view showing the Bi-CMOS semiconductor device manfuctured in accordance with the step shown in FIG. 19.

Thus, with the oxide film being interposed on the joining surface of the CZ silicon wafer and the FZ silicon wafer, the oxide film act as an etching stopper for the FZ silicon wafer 300 for forming contact holes in the step shown in FIG. 16. Accordingly, evenness in the surface of FZ silicon wafer is improved, thus preventing overetching into the side of the CZ silicon wafer. A cross section of a B-CMOS semiconductor device with the oxide film 209 being formed is shown in FIG. 20.

Although in the above-described embodiments, the CMOS region formed of the n channel MOS transistor 350 and the p channel MOS transistor 360 are disclosed, flash memories (batch erase type EEPROM), EPROMs, SRAMs, DRAMs, etc. at least including MOS transistors may be formed in the CMOS region.

As in the foregoing, according to the present invention, the bipolar transistor is formed in the semiconductor layer epitaxially grown on the first semiconductor substrate having a relatively high oxygen concentration, the semiconductor layer is free from slip lines, and, therefore, the electrical characteristics of the bipolar transistor produced will not deteriorate. The field effect transistor is formed in the second semiconductor substrate having a relatively low oxygen concentration, and, therefore, defects such as degradation in the breakdown voltage of the gate oxide film, etc. can be suppressed if reduction in the dimensions of devices further precedes. Consequently, a Bi-CMOS semiconductor device providing superior electrical characteristics both in the field effect transistor and the bipolar transistor can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a first semiconductor substrate having a main surface and containing oxygen in a first concentration;
a semiconductor layer epitaxially grown on the main surface of said first semiconductor substrate;
a second semiconductor substrate joined onto said semiconductor layer and containing oxygen in a second concentration lower than said first concentration;
a bipolar transistor formed in said semiconductor layer and including
an emitter region of first conductivity type formed in said semiconductor layer and having an upper surface, a lower surface and side surfaces,
a base region of second type conductivity formed to surround said lower surface and side surfaces of said emitter region, said base region having an upper surface, a lower surface and side surfaces,
a collector region of the first type conductivity formed to surround said lower surface and side surfaces of said base region; and
a field effect transistor formed in said second semiconductor substrate.

2. A semiconductor device as recited in claim 1, further comprising a first electrode layer in connection with said emitter region, a second electrode layer in connection with said base region, and a third electrode layer in connection with said collector region, with each of said first, second and third electrode layers formed penetrating through said second semiconductor substrate.

3. A semiconductor device as recited in claim 2, wherein
said at least one field effect transistor includes a source region and a drain region formed in said second semiconductor substrate.

4. A semiconductor device as recited in claim 3, further comprising,
an insulating layer formed to cover said at least one field effect transistor and said second semiconductor substrate, and
a plurality of interconnection layers formed penetrating through said insulating layer with each interconnection layer respectively connected to a different one of said first electrode layer, said second electrode layer, said third electrode layer, said source region and said drain region.

5. A semiconductor device, comprising:
a first semiconductor substrate having a main surface and containing oxygen in a first concentration;
a semiconductor layer epitaxially grown on the main surface of said first semiconductor substrate;
a second semiconductor substrate joined onto said semiconductor layer and containing oxygen in a second concentration lower than said first concentration;
a bipolar transistor formed in said semiconductor layer; and
at least two field effect transistors formed in said second semiconductor substrate; wherein
said at least two field effect transistors include a field effect transistor of a first type conductivity and a field effect transistor of a second type conductivity.

6. A semiconductor device, comprising:
a first semiconductor substrate having a main surface and containing oxygen in a first concentration;
a semiconductor layer epitaxially grown on the main surface of said first semiconductor substrate;
a second semiconductor substrate having a thickness in the range from 10 to 750 $\mu m$ joined onto said semiconductor layer and containing oxygen in a second concentration lower than said first concentration;

a bipolar transistor formed in said semiconductor layer; and a field effect transistor formed in said second semiconductor substrate.

7. A semiconductor device, comprising:

a first semiconductor substrate having a main surface and containing oxygen in a first concentration;

a semiconductor layer epitaxially grown on the main surface of said first semiconductor substrate;

an oxide layer formed on said semiconductor layer;

a second semiconductor substrate formed on said oxide layer and containing oxygen in a second concentration lower than said first concentration;

a bipolar transistor formed in said semiconductor layer; and at least one field effect transistor formed in said second semiconductor substrate.

* * * * *